United States Patent [19]

Matsumoto et al.

[11] Patent Number: 4,764,937
[45] Date of Patent: Aug. 16, 1988

[54] SEMICONDUCTOR LASER ARRAY DEVICE

[75] Inventors: Mitsuhiro Matsumoto; Sadayoshi Matsui, both of Tenri; Mototaka Taneya, Nara; Hidenori Kawanishi, Higashioska, all of Japan

[73] Assignee: Sharp Kabushiki Kaisha, Osaka, Japan

[21] Appl. No.: 893,226

[22] Filed: Aug. 5, 1986

[30] Foreign Application Priority Data

Aug. 9, 1985 [JP] Japan .................................. 60-176183

[51] Int. Cl.⁴ ................................................ H01S 3/19
[52] U.S. Cl. ........................................ 372/50; 372/46; 372/48
[58] Field of Search ................... 372/48, 50, 43, 18, 372/32, 44, 46

[56] References Cited

U.S. PATENT DOCUMENTS 4,255,717 3/1981 Scifres et al. ......................... 372/50

FOREIGN PATENT DOCUMENTS 0102087 5/1986 Japan ..................................... 372/43

OTHER PUBLICATIONS

Welch, D. F. (1985), 21:14, pp. 603–605, "High-Power (575–mw) Single-Lobed Emissions From a Phased-Aray Laser" Electron Lett.

Primary Examiner—James W. Davie
Assistant Examiner—B. Randolph
Attorney, Agent, or Firm—Ciotti & Murashige, Irell & Manella

[57] ABSTRACT

A semiconductor laser array device comprising two or more array portions, which are composed of a plurality of main parallel waveguides with an optical phase coupling in between, and one or more branching portions, each of which is positioned between the array portions and which are composed of two branching waveguides branching symmetrically with regard to the main waveguide direction from each of the main parallel waveguides of the array portions, each of the two branching waveguides positioned at the outer sides of each of the branching portions being disconnected with the adjacent branching waveguides and the other branching waveguides from the main parallel waveguides of one of the array portions being optically connected with the corresponding branching waveguides from the main parallel waveguides of the adjacent array portion.

3 Claims, 3 Drawing Sheets

Angle (Degrees)

SEMICONDUCTOR LASER ARRAY DEVICE

BACKGROUND OF THE INVENTION

1. Field of the invention

This invention relates to a semiconductor laser array device.

2. Description of the prior art

Semiconductor laser devices having a single lasing filament structure can only produce 80 mW laser lights at their best. In order to produce high optical output power, semiconductor laser devices, in which a plurality of lasing filaments are disposed in a parallel manner on a single substrate to achieve an optical phase coupling between the adjacent lasing filaments, have been studied.

As shown in FIG. 6, in the case where a plurality of semiconductor lasers R are disposed in a parallel manner with an optical phase coupling between the adjacent semiconductor lasers and the individual semiconductor lasers R have the same gain, they tend to oscillate laser lights with a 180° phase-shift therebetween as indicated by curve 2 in FIG. 6 rather than with a 0° phase-shift therebetween as indicated by curve 1. This is because the optical intensity distribution is in accord with the gain distribution in the 180° phase-shift mode rather than in the 0° phase-shift mode, resulting in high oscillation gain.

The far-field pattern of laser lights with a 0° phase-shift therebetween exhibits a single peak so that the laser lights can be concentrated into a single spot by means of optical lenses, whereas the far-field pattern of laser lights with a 180° phase-shift therebetween exhibits dual peaks so that the laser lights cannot be concentrated into a single spot by any optical lens. These semiconductor laser array devices producing laser lights which cannot be concentrated into a single spot are inconvenient for optical coupling with other optical systems, and cannot be used as light sources for optical discs, etc. Thus, semiconductor laser array devices producing laser lights with a 0° phase-shift therebetween are required.

FIG. 7 shows the waveguide structure of a conventional semiconductor laser array device which selectively oscillates laser lights with a 0° phase-shift therebetween, wherein laser lights with 0° phase-shift therebetween are propagated from the array portion 11 (or 12) to the array portion 12 (or 11) through the branching portion 10 without loss due to optical interference therebetween. However, when laser lights with a 180° phase-shift therebetween are propagated from the array portion 11 or 12 to the branching portion 10, they undergo loss, to a great extent, due to the optical interference therebetween, resulting in little optical output power. Therefore, this semiconductor laser array device can selectively oscillate laser lights in a 0° phase-mode. However, with the semiconductor laser array device having the above-mentioned waveguide structure, it can be observed that a third-type oscillation mode (i.e., an interim-mode) other than the 0° phase-mode and the 180° phase-mode arises with an increase in optical output power. This phenomenon can be explained below with reference to FIG. 7.

When laser lights of the interim-mode 20 are propagated from the array portion 12 to the array portion 11 through the branching portion 10, they are converted into laser lights of a 180° phase-mode 21 without loss. On the contrary, when laser lights of the 180° phase-mode 21 are propagated from the array potion 11 to the array portion 12 through the branching portion 10, some of them are weakened due to optical interference therebetween (wherein the optical power loss is approximately 3 dB) and the others are converted into laser lights of the interim-mode 20.

As mentioned above, although laser lights oscillated in an interim-mode undergo loss due to the optical interference therebetween, the degree of loss thereof is relatively lower than that of laser lights oscillated in a 180° phase-mode. Thus, even though the conventional semiconductor laser array device oscillates laser lights in a 0° phase-mode, when the optical output power increases, the laser array device unavoidably oscillates laser lights in an interim-mode.

SUMMARY OF THE INVENTION

The semiconductor laser array device of this invention, which overcomes the above-discussed and numerous other disadvantages and deficiencies of the prior art, comprises two or more array portions, which are composed of a plurality of main parallel waveguides with an optical phase coupling therebetween, and one or more branching portions, each of which is positioned between said array portions and which are composed of two branching waveguides branching symmetrically with regard to the main waveguide direction from each of the main parallel waveguides of said array portions, each of the two branching waveguides positioned at the outer sides of each of the branching portions being disconnected with the adjacent branching waveguides and the other branching waveguides from the main parallel waveguides of one of said array portions being optically connected with the corresponding branching waveguides from the main parallel waveguides of the adjacent array portion.

The semiconductor laser array device contains, in a preferred embodiment, one branching portion.

The semiconductor laser array device contains, in a more preferred embodiment, two branching portions.

Thus, the invention described herein makes possible to objects of (1) providing a semiconductor laser array device having a plurality of lasing filaments in a parallel manner with an optical phase coupling therebetween on a single substrate, which attains a 0° phase-shift between the adjacent lasing filaments, resulting in stabilized laser oscillation in a single mode; and (2) providing a semiconductor laser array device having a plurality of lasing filaments in a parallel manner with an optical phase coupling therebetween on a single substrate, which attains stabilized laser oscillation in a single mode with the far-field pattern of a single steep peak up to a high output power level.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
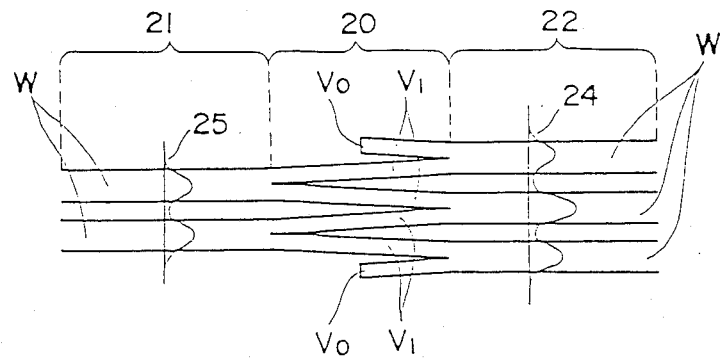
FIG. 1 is a diagram showing the waveguide structure of a semiconductor laser array device of this invention, illustrating the propagation therein of laser lights of a 0° phase-mode.

This invention provides a semiconductor laser array device having a waveguide structure by which oscillation in a 180° phase-mode and other transverse modes can be suppressed, thereby attaining selective oscillation in a 0° phase-mode. FIG. 1 shows the waveguide structure of a semiconductor laser array device of this invention, which comprises an array portion having three waveguides W and an array portion having two waveguides W and a branching portion 20 positioned between the array portions 21 and 22. The waveguides W, W, ... of the array portions 21 and 22 are disposed in a parallel manner with an optical phase coupling between the adjacent waveguides. In the branching portion 20, two branching waveguides $V_0$, $V_0$, $V_1$, $V_1$, ... branch symmetrically with regard to the main waveguide direction from each of the main waveguides W, W, ... of the array portions 21 and 22. EAch of the two branching waveguides $V_0$ and $V_0$ positioned at the outer sides of the branching portion 20 are disconnected with the adjacent branching waveguides. The other branching waveguides $V_1$, $V_1$, ... from the main waveguides W, W, ... of the array portion 22 are optically connected with the corresponding branching waveguides $V_1$, $V_1$, ... from the main waveguides W, W, ... of the array portion 21.

Figure 2A:
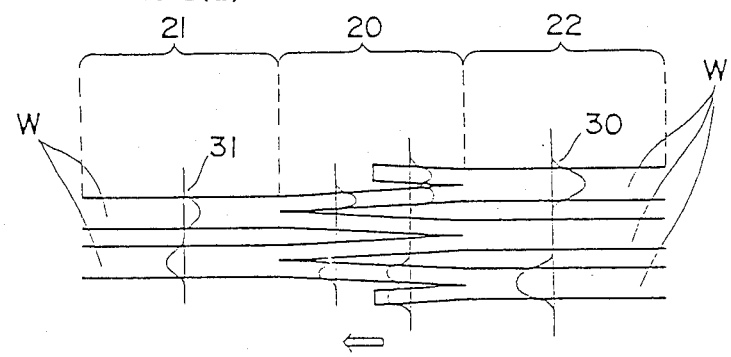
FIGS. 2(a) and 2(b) are diagrams illustrating the propagation of laser lights of an interim-mode in the waveguide structure shown in FIG. 1.
Figure 2B:
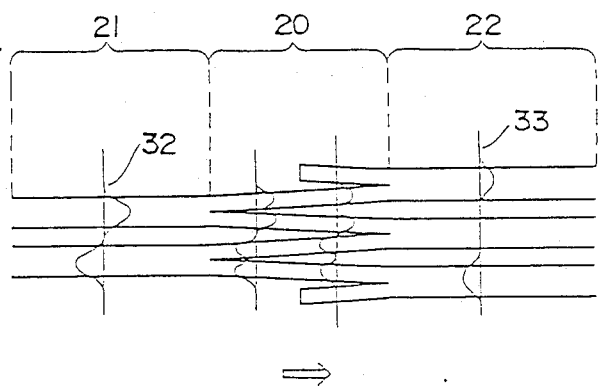

The operation principle of this semiconductor laser array device is described below. When laser lights of a 0° phase-mode 24 are propagated from the array portion 22 to the array portion 21 through the branching portion 20, they are converted into laser lights of a 0° phase-mode 25. The amount of light radiated when laser lights are propagated in the branching waveguides $V_0$ of the branching portion 20 is lost. The optical power loss is as small as about 1.2 dB. Laser lights reflected by the facet of the array device undergo little loss in the branching portion 20. On the other hand, when laser lights of a 180° phase-mode are propagated from the array portions 22 to the array portion 21 through the branching portion 20, they undergo a great amount of loss, so that the optical output power of this device becomes almost zero. On the contrary, as shown in FIG. 2(a), when laser lights of an interim-mode 30 are propagated from the array portion 22 to the array portion 21 through the branching portion 20, they undergo loss at the branching waveguides $V_0$ and $V_0$ to a graater extend than laser lights of a 0° phase-mode. The optical power loss is approximately 3 dB. The laser lights are converted into laser lights of a 180° phase-mode 31 at the array portion 21, which are then reflected by the facet, resulting in laser lights of a 180° phase-mode 32, as shown in FIG. 2(b), which pass through the branching portion 20 wherein the laser lights undergo loss of approximately 3 dB due to the optical interference therebetween. The laser lights are then converted into laser lights of an interim-mode 33 at the array portion 22. As a result, the laser lights of the interim-mode 30 undergo a loss of approximately 6 dB while they make a round trip within the resonator. Therefore, the optical power loss of the laser lights of an interim-mode is approximately 4.8 dB greater than that of the laser lights of a 0° phase-mode.

As mentioned above, the semiconductor laser array device having the above-described waveguide structure exhibits a greater difference in optical loss between laser lights of an interim-mode and laser lights of a 0° phase-mode than a conventional semiconductor laser array device, so that the array device of this invention can suppress laser oscillation in an interim-mode, thereby attaining laser oscillation in a single mode with a 0° phase-mode at a high output power level.

Figure 3:
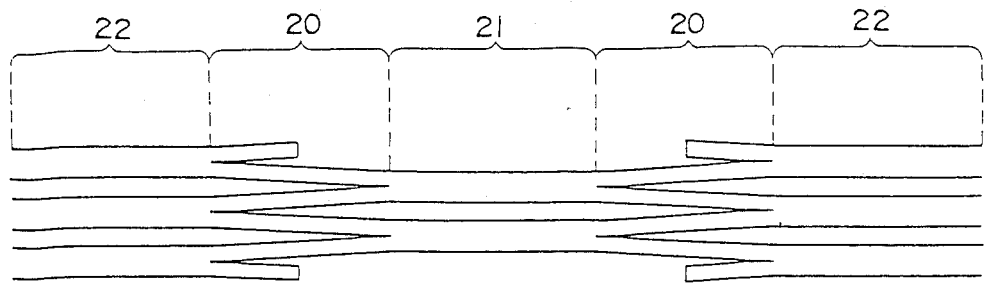
FIG. 3 is a diagram showing trhe waveguide structure of another semiconductor laser array device of this invention.

FIG. 3 shows another semiconductor laser array device of this invention having a waveguide structure, which contains two branching portions 20 and 20 within the resonator, resulting in a 0° phase-mode selection effect which is twice that of the waveguide structure shown in FIG. 1. Thus, this array device can attain laser oscillation in a single mode with a 0° phase-mode up to a higher output power level than the array device shown in FIG. 1.

EXAMPLE 1

Figure 4:
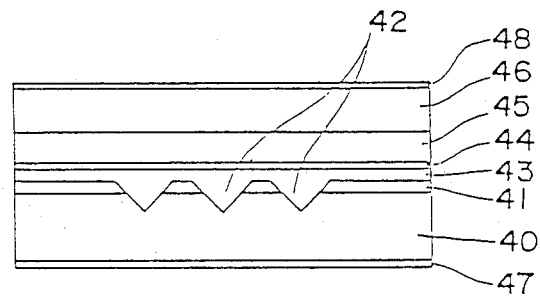
FIG. 4 is a front view showing one of the facets of the semiconductor laser array device of this invention shown in FIG. 1.

A semiconductor laser array device of this invention having the waveguide structure shown in FIG. 1 is a combination of a VSIS (V-channeled substrate inner stripe) semiconductor laser and an index guided semiconductor laser. FIG. 4 shows a front view showing this semiconductor laser array device, which was produced as follows: On a p-GaAs substrate 40, an n-GaAs current blocking layer 41 was grown by a crystal growth technique such as liquid phase epitaxy, followed by a photolithographic treatment and an etching treatment to form V-channels 42 in the form of the optical waveguides shown in FIG. 1 in a manner to reach the substrate 40 throguh the current blocking layer 41. The portion of each of the channels 42 positioned in the substrate 40 functions as a current path. Then, on the current blocking layer 41 containing the channels 42, a p-$Al_xGa_{1-x}As$ cladding layer 43, a p- or n- $Al_yGa_{1-y}As$ active layer 44, an n-$Al_xGa_{1-x}As$ cladding layer 45, and an n+-GaAs cap layer 46 were successively grown by liquid phase epitaxy (wherein x>y), resulting in a double-hetero-structure multi-layered crystal for laser oscillation. Then, a p-sided ohmic contact 47 and an n-sided ohmic contact 48 were formed on the back face of the substrate 40 and the upper face of the cap layer 46, respectively, followed by cleaving to form laser mirrors at both facets at right angles to the striped channel direction, resulting in an array device unit having an internal cavity length of 200–300 μm. The facets were then coated with an $Al_2O_3$ thin film having a thickness of the half of the laser light wvelength and having a reflectivity of 32%. The array device unit was then mounted on a copper block (not shown) by a soldering material, resulting in a semiconductor laser array device.

When current was injected into the active layer 44, which is disposed in a plane over the V-channels 42, through the ohmic contacts 47 and 48 and the current path within each of the V-channels 42, laser oscillation began within the portions of the active layer 44 corresponding to the V-channels 42.

Since the V-channels 42 were formed within the semiconductor laser array device with the correspondence to the waveguide structure shown in FIG. 1, the waveguides for laser oscillation within the active layer 44 of this semiconductor laser array device were, of course, formed in the form of those shown in FIG. 1.

Figure 5:
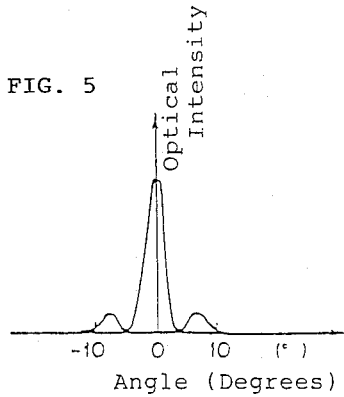
FIG. 5 is a diagram showing the far-field pattern in the horizontal direction attained by the semiconductor laser array device shown in FIG. 1.
Figure 6:
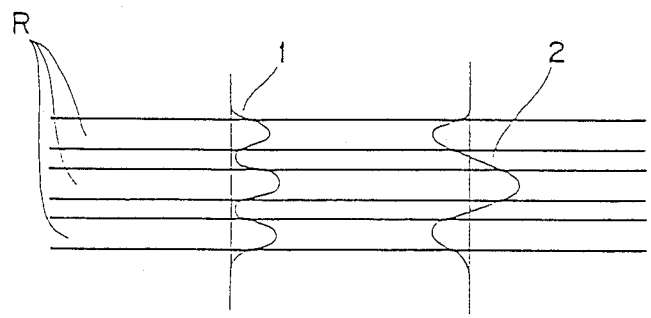
FIG. 6 is a diagram showing a plurality of parallel waveguides with an optical phase coupling therebetween and the phase-modes with which laser lights are propagated in the waveguides.
Figure 7:
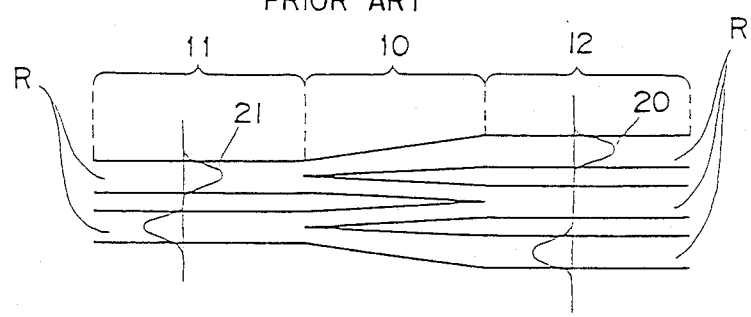
FIG. 7 is a diagram showing the waveguide structure of a conventional semiconductor laser array device, illustrating the propagation therein of laser lights of an interim-mode.

This semiconductor laser array device oscillated laser lights in a single mode with a 0° phase-shift therebetween up to an output power of 50 mW at an oscillation threshold current of about 100 mA. The far-field pattern of laser lights which were radiated by the semiconductor laser array device exhibited a single steep peak having the full-width at half maximum of 4° as shown in FIG. 5. As the output power increases, laser lights of an interim-mode arise, causing the broadening of the full-width at half maximum fo the far-field pattern.

EXAMPLE 2

FIG. 3 shows another semiconductor laser array device of this invention, which was produced in the same manner as in Example 1, except that the V-channels were formed in the form of the waveguides shown in FIG. 3. The semiconductor laser array device oscillated laser lights in a single mode with a 0° phase-shift therebetween up to an optical output power of 80 mW at an oscillation threshold current of about 110 mA. When the optical output power increased over the value to 80 mW, thermal saturation arose.

Although the above-mentioned examples disclose only the GaAs—GaAlAs system, this invention is, of course, applicable to other semiconductor materials such as the InP—InGaAsP system, etc. Moreover, as the striped channel structure, not only a VSIS structure, but also an inner-stripe structure, etc., can be used.

It is understood that various other modifications will be apparent to and can be readily made by those skilled in the art without department from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser array device comprising two or more array portions, the improvement exists in that said array portions are composed of a plurality of main parallel waveguides with an optical phase coupling therebetween, and one or more branching portions, each of which is positioned between said array portions and which are composed of two branching waveguides branching symmetrically with regard to the main waveguide direction from each of the main parallel waveguides of said array portions, each of the two branching waveguides positioned at the outer sides of each of the branching portions being disconnected with the adjacent branching waveguides and the other branching waveguides from the main parallel waveguides of one of said array portions being optically connected with the corresponding branching waveguides from the main parallel waveguides of the adjacent array portion.

2. A semiconductor laser array device according to claim 1, which contains one branching portion.

3. A semiconductor laser array device according to claim 1, which contains two branching portions.

* * * * *